US012812898B2

(12) United States Patent
Yen et al.

(10) Patent No.: US 12,812,898 B2
(45) Date of Patent: Nov. 24, 2026

(54) POWER SEMICONDUCTOR DEVICE

(71) Applicant: INDUSTRIAL TECHNOLOGY RESEARCH INSTITUTE, Hsinchu (TW)

(72) Inventors: Chih-Hung Yen, Taipei City (TW); Hua-Mao Chen, Tainan City (TW); Yu-Ting Chen, Zhubei City (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 358 days.

(21) Appl. No.: 18/401,842

(22) Filed: Jan. 2, 2024

(65) Prior Publication Data

US 2025/0031408 A1 Jan. 23, 2025

Related U.S. Application Data

(60) Provisional application No. 63/527,599, filed on Jul. 19, 2023.

(30) Foreign Application Priority Data

Sep. 19, 2023 (TW) ................................ 112135765

(51) Int. Cl.

*H10D 30/66* (2025.01)
*H10D 62/10* (2025.01)
*H10D 64/27* (2025.01)

(52) U.S. Cl.

CPC ......... *H10D 30/668* (2025.01); *H10D 62/127* (2025.01); *H10D 64/513* (2025.01)

(58) Field of Classification Search

CPC ... H10D 30/668; H10D 64/513; H10D 62/127
See application file for complete search history.

(56) References Cited

U.S. PATENT DOCUMENTS

| | | | | |
|---|---|---|---|---|
| 5,285,093 A * | 2/1994 | Lage | .................... | H10B 10/125 257/334 |
| 7,345,342 B2 | 3/2008 | Challa et al. | | |

(Continued)

FOREIGN PATENT DOCUMENTS

| | | |
|---|---|---|
| CN | 1520616 A | 8/2004 |
| CN | 106158973 A | 11/2016 |

(Continued)

OTHER PUBLICATIONS

Machine translation of WO 2021-088156, 2026.*
Taiwanese Office Action and Search Report for Taiwanese Application No. 112135765, dated May 21, 2024.

*Primary Examiner* — Richard A Booth
(74) *Attorney, Agent, or Firm* — Birch, Stewart, Kolasch & Birch, LLP

(57) ABSTRACT

A power semiconductor device includes a semiconductor substrate, a drift layer, a well region, a doped region, two dummy trenches, a gate structure and a dielectric layer. The semiconductor substrate is doped to have a first conductive channel. The drift layer on the semiconductor substrate is doped to have the first conductive channel. The well region on the drift layer is doped to have a second conductive channel having a polarity opposite to that of the first conductive channel. The doped region on the well region is doped to have the first conductive channel. Two dummy trenches pass through the doped region and the well region. Each of the dummy trenches has a dummy gate. The gate structure has a real gate and is between the dummy trenches. The dielectric layer isolates the dummy gate and the real gate from the doped region, the well region and the drift layer.

12 Claims, 19 Drawing Sheets

(56) References Cited

U.S. PATENT DOCUMENTS

| | | | |
|---|---|---|---|
| 7,843,004 B2 | 11/2010 | Darwish | |
| 10,529,845 B2 | 1/2020 | Mirchandani et al. | |
| 11,152,501 B2 | 10/2021 | Nakano et al. | |
| 11,764,295 B2 * | 9/2023 | Kim ..................... | H10D 62/393 257/288 |

FOREIGN PATENT DOCUMENTS

| | | |
|---|---|---|
| CN | 107221500 A | 9/2017 |
| CN | 114503279 A | 5/2022 |
| JP | 6667893 B2 | 3/2020 |
| TW | 201806003 A | 2/2018 |
| WO | WO 2021/088158 A1 | 5/2021 |

* cited by examiner

| | Comparative example | The depth of the dummy trench is 1 μm | The depth of the dummy trench is 1.5 μm | The depth of the dummy trench is 2 μm | The depth of the dummy trench is 2.5 μm | The depth of the dummy trench is 3 μm | The depth of the dummy trench is 3.5 μm | The depth of the dummy trench is 4 μm |
|---|---|---|---|---|---|---|---|---|
| Depth of dummy trench (μm) | 0 | 1.00 | 1.50 | 2.00 | 2.50 | 3.00 | 3.50 | 4.00 |
| Threshold voltage (V) | 6.12 | 4.71 | 4.53 | 4.62 | 4.40 | 3.99 | 3.09 | 2.97 |
| Breakdown voltage (V) | 1933 | 2247 | 2555 | 2297 | 2300 | 2247 | 2334 | 2300 |
| On-impedance (mW*cm$^2$) | 3.73 | 3.76 | 4.01 | 4.76 | 5.36 | 6.73 | 7.74 | 9.96 |
| Baliga's figure of merit | 1.00E+06 | 1.34E+06 | 1.63E+06 | 1.11E+06 | 9.86E+05 | 7.50E+05 | 7.04E+05 | 5.31E+05 |

FIG. 23

Comparative example

| | Gate-source parasitic capacitance (F) | Drain-source parasitic capacitance (F) | Gate-drain parasitic capacitance (F) | Input power capacitance (F) | Output power capacitance (F) | Feedback capacitance (F) |
|---|---|---|---|---|---|---|
| Comparative example | 1.23E-15 | 1.13E-17 | 1.39E-17 | 1.24E-15 | 2.52E-17 | 1.39E-17 |
| The depth of the dummy trench is 1 μm | 1.31E-15 | 1.39E-17 | 1.16E-17 | 1.33E-15 | 2.55E-17 | 1.16E-17 |
| The depth of the dummy trench is 1.5 μm | 1.31E-15 | 1.69E-17 | 8.96E-18 | 1.32E-15 | 2.59E-17 | 8.96E-18 |
| The depth of the dummy trench is 2 μm | 1.33E-15 | 2.00E-17 | 6.45E-18 | 1.35E-15 | 2.65E-17 | 6.45E-18 |
| The depth of the dummy trench is 3 μm | 1.42E-15 | 2.54E-17 | 3.13E-18 | 1.45E-15 | 2.85E-17 | 3.13E-18 |

FIG. 34

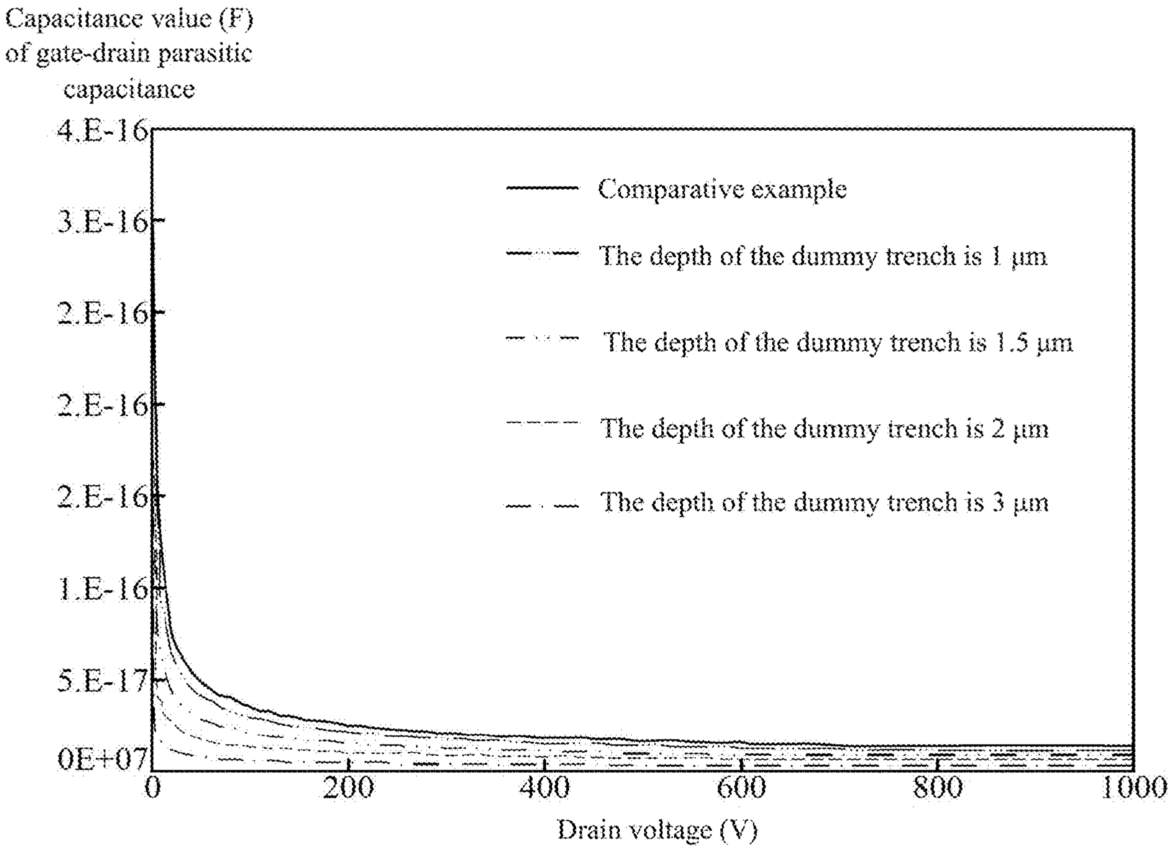

FIG. 35

| | Comparative example | The depth of the dummy trench is 1 μm | The depth of the dummy trench is 1.5 μm | The depth of the dummy trench is 2 μm | The depth of the dummy trench is 3 μm | The depth of the dummy trench is 4 μm |
|---|---|---|---|---|---|---|
| Rise time (s) | 3.91E-09 | 2.98E-09 | 3.19E-09 | 3.96E-09 | 5.64E-09 | 5.80E-09 |
| Fall time (s) | 6.33E-09 | 6.31E-09 | 3.38E-09 | 7.83E-09 | 1.24E-08 | 1.22E-08 |
FIG. 36
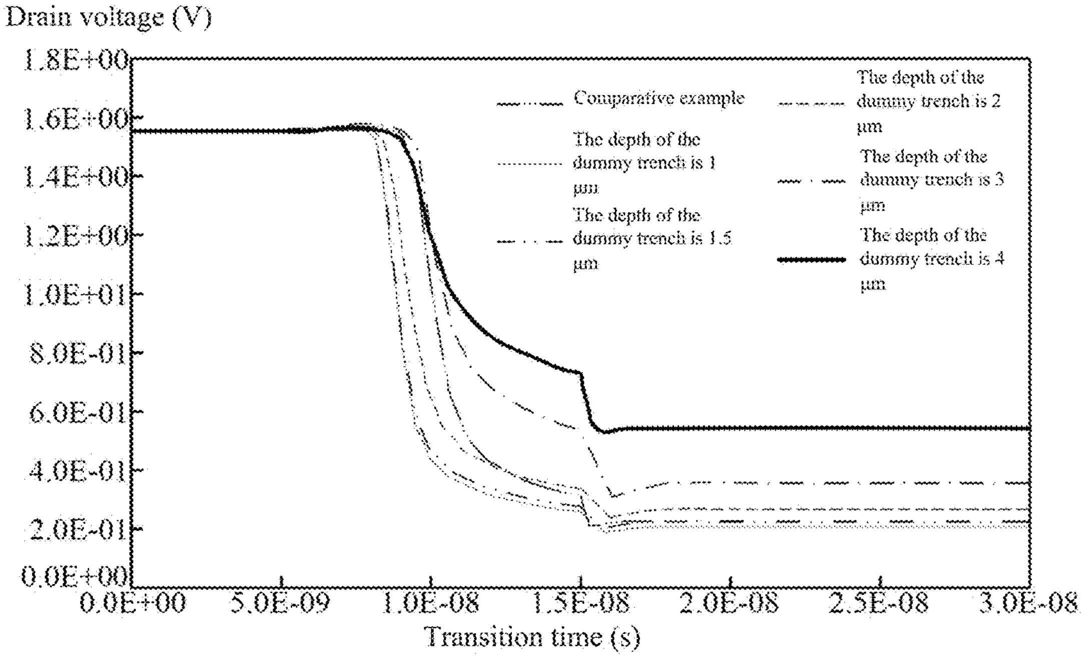
FIG. 37
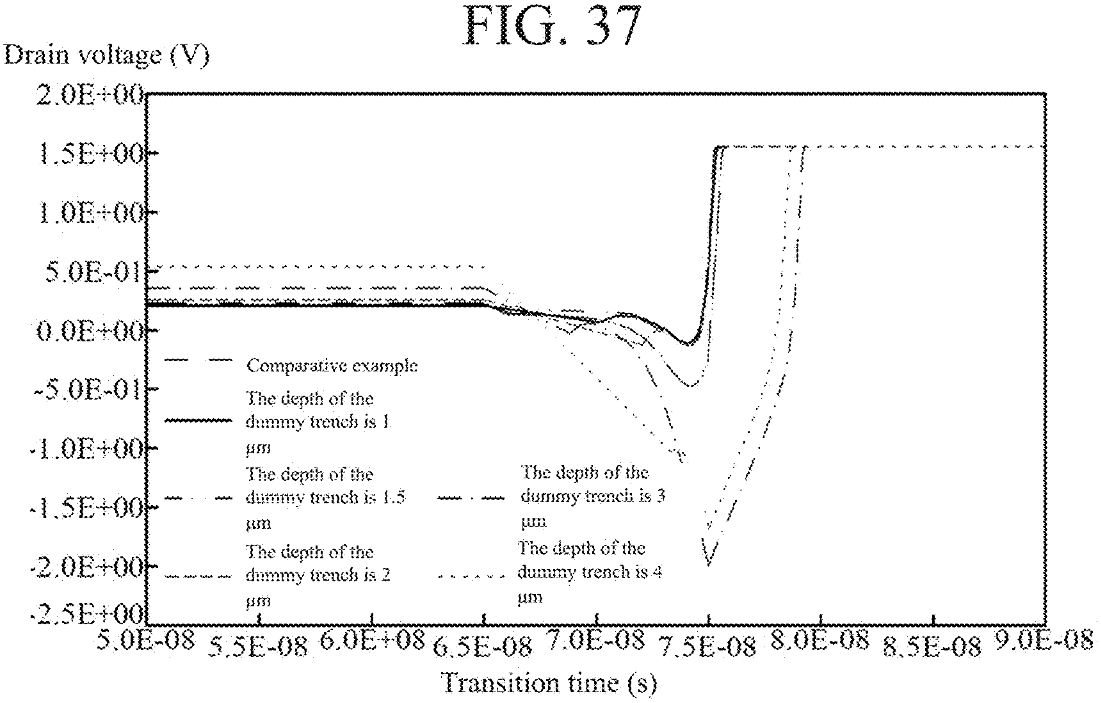
FIG. 38

POWER SEMICONDUCTOR DEVICE

CROSS-REFERENCES TO RELATED APPLICATIONS

This application claims the benefit of U.S. provisional application Ser. No. 63/527,599, filed on Jul. 19, 2023 and claims the priority of patent application No. 112135765 filed in Taiwan, R.O.C. on Sep. 19, 2023. The entirety of the above-mentioned patent applications are hereby incorporated by references herein and made a part of the specification.

BACKGROUND

Technical Field

The field of semiconductors relates to a power semiconductor device.

Related Art

Compared with Metal-Oxide-Semiconductor Field-Effect Transistors (MOSFETs) made of silicon (Si)-based materials, MOSFETs made of silicon carbide (SIC) materials have higher carrier mobility, faster switching speed and less switching loss. Compared with vertical double-diffused MOSFETs (VD-MOSFETs), vertical trench MOSFETs (Trench MOSFETs, or Trench Gate MOSFETs, or UMOSFETs) have smaller on-resistance and less switching loss.

However, due to the structural design, both VD-MOSFETs and Trench MOSFETs may cause early avalanche breakdown of the VD-MOSFETs and Trench MOSFETs (for example, the bottom of the well region or the bottom of the gate trench is broken down by electric field) due to the concentration of the electric field in the boundary of the well region (e.g., a well region of a P-type semiconductor) or the corner of the gate trench. As a result, VD-MOSFETs and Trench MOSFETs have lower voltage resistance (i.e., smaller breakdown voltage).

SUMMARY

The present disclosure provides a power semiconductor device. The power semiconductor device includes a semiconductor substrate, a drift layer, a well region, a doped region, two dummy trenches, a gate structure and a dielectric layer. The semiconductor substrate is doped with a first element in a first element family to have a first conductive channel. The drift layer is on the semiconductor substrate and doped with a second element in the first element family to have the first conductive channel. The well region is on the drift layer and doped with a third element in a second element family to have a second conductive channel. The second conductive channel has a polarity opposite to that of the first conductive channel. The doped region is on the well region and doped with a fourth element in the first element family to have the first conductive channel. The two dummy trenches pass through the doped region and the well region. Each of the dummy trenches has a dummy gate. The gate structure has a real gate and is between the two dummy trenches. The dielectric layer isolates each dummy gate and the real gate from the doped region, the well region and the drift layer.

According to some embodiments, the present disclosure can balance the charge and uniformly disperse the electric field through dummy trenches and dummy gates thereof, so that the electric field is not concentrated at the bottom of the well region or the bottom of the gate structure (e.g., the bottom end of the gate trench). In this way, the voltage resistance capability of the power semiconductor device can be increased (i.e., the breakdown voltage can be increased), so that avalanche breakdown occurs in the power semiconductor device later.

BRIEF DESCRIPTION OF THE DRAWINGS

FIG. 23 is a schematic diagram of characteristic parameters of a power semiconductor device without a dummy trench according to a comparative example and characteristic parameters of a power semiconductor device at different distances between a top end and a bottom end of a dummy trench according to some embodiments;

FIG. 34 is a schematic diagram of a parasitic capacitance of a power semiconductor device without a dummy trench according to a comparative example and a parasitic capacitance of a power semiconductor device at different distances between a top end and a bottom end of a dummy trench according to some embodiments;

FIG. 35 is a schematic diagram of a characteristic curve between a gate-drain parasitic capacitance ($C_{gd}$) and a drain voltage of a power semiconductor device without a dummy trench according to a comparative example and a characteristic curve between a gate-drain parasitic capacitance and a drain voltage of a power semiconductor device at different distances between a top end and a bottom end of a dummy trench according to some embodiments:

FIG. 36 is a schematic diagram of rise time and fall time of a power semiconductor device without a dummy trench according to a comparative example and rise time and fall time of a power semiconductor device at different distances between a top end and a bottom end of a dummy trench according to some embodiments;

FIG. 37 is a schematic diagram of a characteristic curve between a drain voltage and transition time of a power semiconductor device without a dummy trench when being turned on (i.e., conductively) according to a comparative example and a characteristic curve between a drain voltage and transition time of a power semiconductor device when being turned on at different distances between a top end and a bottom end of a dummy trench according to some embodiments; and FIG. 38 is a schematic diagram of a characteristic curve between a drain voltage and transition time of a power semiconductor device without a dummy trench when being turned off (i.e., non-conductively) according to a comparative example and a characteristic curve between a drain voltage and transition time of a power semiconductor device when being turned off at different distances between a top end and a bottom end of a dummy trench according to some embodiments.

DETAILED DESCRIPTION

Figure 1:
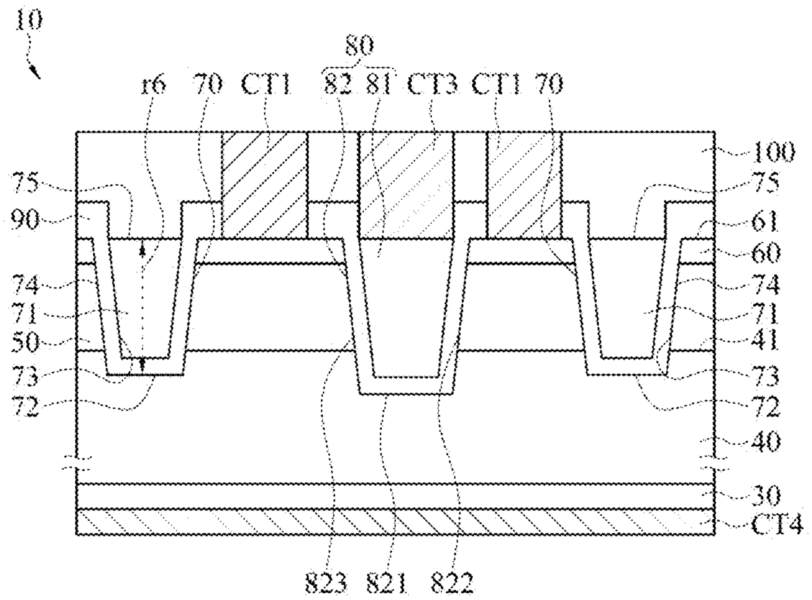
FIG. 1 is a schematic diagram of a component structure of a power semiconductor device according to a first embodiment.

FIG. 1 is a schematic diagram of a component structure of a power semiconductor device 10 according to a first embodiment. The power semiconductor device 10 includes a semiconductor substrate 30, a drift layer 40, a well region 50, a doped region 60, two dummy trenches 70, a gate structure 80 and a dielectric layer 90. The semiconductor substrate 30 is doped with a certain element (hereinafter referred to as a first element) in a first element family to have a first conductive channel. The drift layer 40 is on the semiconductor substrate 30. The drift layer 40 is doped with a certain element (hereinafter referred to as a second element) in the first element family to have a first conductive channel. The well region 50 is on the drift layer 40. The well region 50 is doped with a certain element (hereinafter referred to as a third element) in a second element family to have a second conductive channel. The second conductive channel has a polarity opposite to that of the first conductive channel. Specifically, the polarity of a charge carrier (i.e., majority carrier) flowing in the second conductive channel is opposite the polarity of a charge carrier flowing in the first conductive channel. For example, when the power semiconductor device 10 is an N-type MOSFET, the charge carrier flowing in the first conductive channel is a free electron, and the charge carrier flowing in the second conductive channel is an electron hole. When the power semiconductor device 10 is a P-type MOSFET, the charge carrier flowing in the first conductive channel is an electron hole, and the charge carrier flowing in the second conductive channel is a free electron. The doped region 60 is on the well region 50. The doped region 60 is doped with a certain element (hereinafter referred to as a fourth element) in the first element family to have a first conductive channel. Two dummy trenches 70 pass through the doped region 60 and the well region 50. Each dummy trench 70 has a dummy gate 71. The gate structure 80 is between the two dummy trenches 70. The gate structure 80 has a real gate 81. The dielectric layer 90 isolates each dummy gate 71 and the real gate 81 from the doped region 60, the well region 50 and the drift layer 40.

When the power semiconductor device 10 is in an ON state (e.g., when the power semiconductor device 10 is an N-type MOSFET, a positive voltage is applied to the real gate 81, so that an inversion channel in which the charge carrier flows is formed between the gate structure 80, the doped region 60 and the well region 50), the charge carrier flows from the doped region 60 through the well region 50 and the drift layer 40 to the semiconductor substrate 30, to establish a current path between the doped region 60 and the semiconductor substrate 30. The real gate 81 refers to an electrode (i.e., a gate of the power semiconductor device 10) that controls the electron mobility of the charge carrier by applying a voltage to control the formation of the inversion channel, and the formation of the inversion channel is independent of the dummy trench 70 and the dummy gate 71 thereof.

The drift layer 40 and the well region 50 are subjected to an electric field formed by the voltage applied to a drain and a source of the power semiconductor device 10. When a voltage difference between the drain and the source (i.e., a drain-source voltage (Vas)) exceeds a rated inverse bias value of a diode formed by a PN junction between the drift layer 40 and the well region 50, the power semiconductor device 10 is in a breakdown state. That is, the rated inverse bias value of the diode formed by the PN junction between the drift layer 40 and the well region 50 is the breakdown voltage of the power semiconductor device 10. The present disclosure can balance charge distribution through the dummy trench 70 and the dummy gate 71 thereof, so as to uniformly disperse electric field distribution in the drift layer 40 and the well region 50. Specifically, through the dummy trench 70 and the dummy gate 71 thereof, the electric field is distributed at a bottom end 72 of the dummy trench 70 and the bottom of the gate structure 80 or distributed at the bottom end 72 of the dummy trench 70 and the bottom of the well region 50, and the electric field is not concentrated at the bottom of the gate structure 80 or the bottom of the well region 50. Because the dummy trench 70 and the dummy gate 71 thereof form the capacitance effect, so that the electric field is attracted to the bottom end 72 of the dummy trench 70, and the electric field is not only concentrated at the bottom of the gate structure 80 or the bottom of the well region 50. In this way, the voltage resistance capability of the power semiconductor device 10 can be increased (i.e., the breakdown voltage can be increased), and it is difficult for the power semiconductor device 10 to enter the breakdown state. If there is no dummy trench 70 and dummy gate 71 thereof, the electric field may be concentrated at the bottom of the gate structure 80 or the bottom of the well region 50, resulting in that a power semiconductor device without the dummy trench 70 and the dummy gate 71 thereof has poor voltage resistance capability (i.e., the breakdown voltage is small) and is easier to enter the breakdown state.

In some embodiments, the first element, the second element, the third element and the fourth element respectively doped by the semiconductor 30, the drift layer 40, the well region 50 and the doped region 60 are realized through an electric dopant. In some embodiments, the first element family and the second element family are different element families. For example, when the power semiconductor device 10 is an N-type MOSFET, the first element family is a pentavalent element family, and the second element family is a trivalent element family, and in this case, the semiconductor 30, the drift layer 40, and the doped region 60 form an N-type semiconductor due to the doping of elements in the pentavalent element family, and the well region 50 forms a P-type semiconductor due to the doping of element in the trivalent element family. When the power semiconductor device 10 is a P-type MOSFET, the first element family is a trivalent element family, and the second element family is a pentavalent element family, and in this case, the semiconductor 30, the drift layer 40, and the doped region 60 form a P-type semiconductor due to the doping of elements in the trivalent element family, and the well region 50 forms an N-type semiconductor due to the doping of element in the pentavalent element family. Elements in the trivalent element family are trivalent atoms such as boron (B), aluminum (Al), gallium (Ga), and indium (In). Elements in the pentavalent element family are pentavalent atoms such as nitrogen (N), arsenium (As), tellurium (Te), phosphorus (P), and bismuth (Bi). In some embodiments, the first element, the second element and the fourth element can be the same or different elements in the first element family. In some embodiments, the concentration of the first element doped in the semiconductor substrate 30 is greater than the concentration of the second element doped in the drift layer 40, the concentration of the third element doped in the well region 50 is greater than the concentration of the second element doped in the drift layer 40, and the concentration of the fourth element doped in the doped region 60 is greater than the concentration of the third element doped in the meteorite region 50.

In some embodiments, the semiconductor substrate 30 is formed by silicon carbide, silicon, gallium nitride (GaN) or sapphire. In some embodiments, the real gate 81 and the dummy gate 71 can be formed by the same or different conductive materials, such as poly-silicon (Poly-Si), titanium (Ti), aluminum, tungsten (W) or gold (Au).

As shown in FIG. 1, in some embodiments, the gate structure 80 includes a gate trench 82 passing through the doped region 60 and the well region 50. The real gate 81 is in the gate trench 82. In this way, when the power semiconductor device 10 is subjected to an electric field, the electric field is distributed at a bottom end 72 of the dummy trench 70 and a bottom end 821 of the gate trench 82. In some embodiments, the bottom end 821 of the gate trench 82 extends into the top 41 of the drift layer 40. In some embodiments, the bottom end 72 of the dummy trench 70 extends into the top 41 of the drift layer 40. In some embodiments, the profiles of the gate trench 82 and the dummy trench 70 are of the same or different shapes, such as trapezoidal or elongated.

As shown in FIG. 1, in some embodiments, the dielectric layer 90 is distributed on an inner wall 73 of the dummy trench 70, an inner wall 822 of the gate trench 82, and a top surface 61 of the doped region 60. The dummy gate 71 is in the dummy trench 70, and is in contact with the dielectric layer 90 on the inner wall 73 of the dummy trench 70. In this way, the dielectric layer 90 isolates the dummy gate 71 from the doped region 60, the well region 50 and the drift layer 40 that are in contact with an outer wall 74 of the dummy trench 70. The real gate 81 is in the gate trench 82, and is in contact with the dielectric layer 90 on the inner wall 822 of the gate trench 82. In this way, the dielectric layer 90 isolates the real gate 81 from the doped region 60, the well region 50 and the drift layer 40 that are in contact with an outer wall 823 of the gate dummy trench 82.

Figure 2:
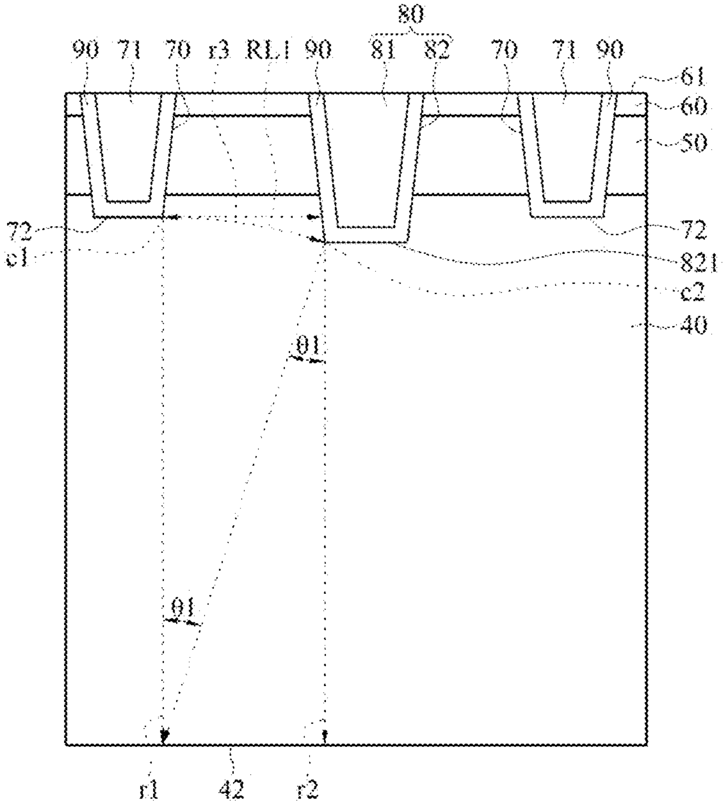
FIG. 2 is a partial schematic diagram of a component structure of a power semiconductor device according to a first embodiment.

FIG. 2 is a partial schematic diagram of a component structure of a power semiconductor device 10 according to a first embodiment. In some embodiments, a distance r1 between the bottom end 72 of each dummy trench 70 and the bottom 42 of the drift layer 40 is greater than or equal to a distance r2 between the bottom end 821 of the gate trench 82 and the bottom 42 of the drift layer 40. That is, a depth of each dummy trench 70 (herein, a distance that the bottom end 72 of the dummy trench 70 extends downward from the top surface 61 of the doped region 60) is less than or equal to a depth of the gate trench 82 (herein, a distance that the bottom end 821 of the gate trench 82 extends downward from the top surface 61 of the doped region 60). In other words, the bottom end of the gate structure 80 (e.g., the bottom end 821 of the gate trench 82) is lower than or equal to the bottom end 72 of each dummy trench 70. For clarity, FIG. 2 only illustrates that the distance r1 between the bottom end 72 of each dummy trench 70 and the bottom 42 of the drift layer 40 is greater than the distance r2 between the bottom end 821 of the gate trench 82 and the bottom 42 of the drift layer 40. In some embodiments, a difference between the distance r1 between the bottom end 72 of each dummy trench 70 and the bottom 42 of the drift layer 40 and the distance r2 between the bottom end 821 of the gate trench 82 and the bottom 42 of the drift layer 40 is less than 1 μm. In this way, the electric field can be uniformly dispersed effectively.

As shown in FIG. 2, in some embodiments, the distance r1 between the bottom end 72 of each dummy trench 70 and the bottom 42 of the drift layer 40 is the distance r2 between the bottom end 821 of the gate trench 82 and the bottom 42 of the drift layer 40 divided by a cosine value of a first central angle $\theta_1$ (as shown in Equation 1). The first central angle $\theta_1$ corresponds to a first arc length RL1, two ends of the first arc length RL1 are a first corner c1 of the bottom end 72 of the dummy trench 70 and a second corner c2 of the bottom end 821 of the gate trench 82 adjacent to the dummy trench 70 respectively, the center of a circle where the first arc length RL1 is located is a point where the first corner c1 is vertically projected to the surface of the semiconductor substrate 30 (or the bottom 42 of the drift layer 40), and the radius is the distance r1.

$$r1 = \frac{r2}{\cos\theta_1} \quad \text{(Equation 1)}$$

As shown in FIG. 2, in some embodiments, the distance r3 between two sides of the gate trench 82 and two dummy trenches 70 (specifically, the distance r3 is the distance between one side of the gate trench 82 and the adjacent dummy trench 70) is substantially the distance r1 between the bottom end 72 of each dummy trench 70 and the bottom 42 of the drift layer 40 multiplied by a sine value of the first central angle $\theta_1$ (as shown in Equation 2).

$$r3 = r1 * \sin\theta_1 \quad \text{(Equation 2)}$$

In some embodiments, the distance r3 between two sides of the gate trench 82 and two dummy trenches 70 is less than 8 μm. In embodiments, the distance r3 between two sides of the gate trench 82 and two dummy trenches 70 is less than 2 μm. In this way, an effective charge balancing effect can be achieved.

Figure 3:
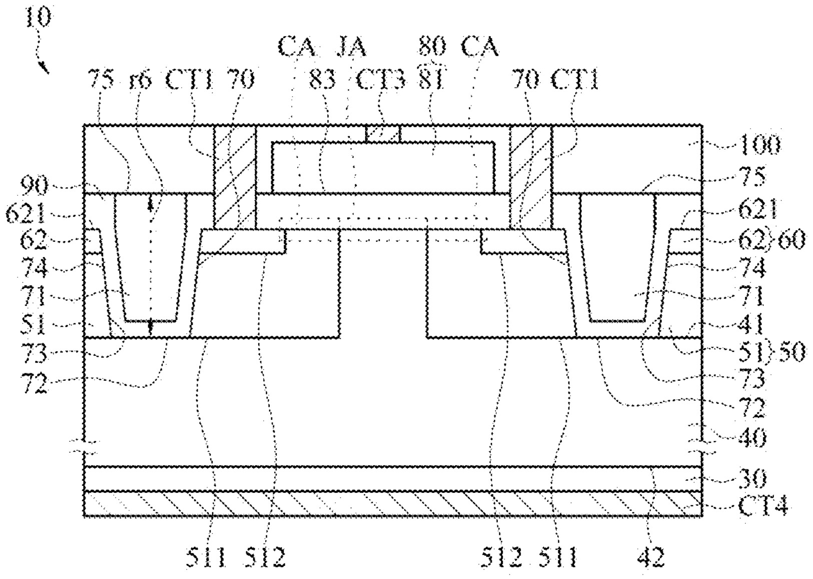
FIG. 3 is a schematic diagram of a component structure of a power semiconductor device according to a second embodiment.

FIG. 3 is a schematic diagram of a component structure of a power semiconductor device 10 according to a second embodiment. The difference from the first embodiment is that, in the second embodiment, the gate structure 80 is on the dielectric layer 90, and the bottom 83 of the gate structure is in contact with the dielectric layer 90 and is higher than the bottom end 72 of the dummy trench 70. For example, a distance between the bottom end 83 of the gate structure and the bottom 42 of the drift layer 40 is greater than a distance between the bottom end 72 of the dummy trench 70 and the bottom 42 of the drift layer 40. The doped region 60 includes two doped sub-regions 62 below the dielectric layer 90, and a top surface 621 of the doped sub-region 62 is in contact with the dielectric layer 90. Two ends of the gate structure 80 face the two doped sub-regions 62 respectively, and vertical projections thereof are at the inner side of one end of the corresponding doped sub-region 62. The well region 50 includes two well sub-regions 51 respectively below the two doped sub-regions 62. Two dummy trenches 70 respectively pass through the two doped sub-regions 62, and respectively pass through the two well sub-regions 51 below the two doped sub-regions 62. Specifically, one of the two dummy trenches 70 (e.g., the dummy trench 70 on the left side of the figure) passes through one of the two doped sub-regions 62 (e.g., the doped sub-region 62 on the left side of the figure) and the well sub-region 51 (e.g., the well sub-region 51 on the left side of the figure) below the doped sub-region 62, and the other one of the two dummy trenches 70 (e.g., the dummy trench 70 on the right side of the figure) passes through the other one of the two doped sub-regions 62 (e.g., the doped sub-region 62 on the right side of the figure) and the well sub-region 51 (e.g., the well sub-region 51 on the right side of the figure) below the doped sub-region 62. In this way, when the power semiconductor device 10 is subjected to an electric field, the electric field is distributed at the bottom end 72 of the dummy trench 70 and the bottom 511 of the well sub-region 51 due to the capacitive effect of the dummy trench 70 and the dummy gate 71 thereof.

As shown in FIG. 3, in some embodiments, the two doped sub-regions 62 are horizontally isolated from each other, and the two well sub-regions 51 are horizontally isolated from each other. In some embodiments, a transverse width of the doped sub-region 62 is shorter than a transverse width of the well sub-region 51. The doped sub-region 62 covers part of the top 512 of the well sub-region 51, and the remaining area of the top 512 of the well sub-region 51 (i.e., an area of the top 512 of the well sub-region 51 that is not covered by the doped sub-region 62) is hereinafter referred to as an inversion channel area CA. In some embodiments, the well sub-region 51 covers part of the top 41 of the drift layer 40, and the remaining area of the top 41 of the drift layer 40 (i.e., an area of the top 41 of the drift layer 40 that is not covered by the well sub-region 51) is hereinafter referred to as a junction area JA.

As shown in FIG. 3, in some embodiments, the dielectric layer 90 is distributed on the inner wall 73 of the dummy trench 70, a top surface 621 of the doped sub-region 62, the inversion channel region CA, and the junction area JA. The dummy gate 71 is in the dummy trench 70, and is in contact with the dielectric layer 90 on the inner wall 73 of the dummy trench 70. In this way, the dielectric layer 90 isolates the dummy gate 71 from the doped sub-region 62, the well sub-region 51 and the drift layer 40 that are in contact with the outer wall 74 of the dummy trench 70. The real gate 81 of the gate structure 80 is in contact with the dielectric layer 90. Specifically, the dielectric layer 90 in contact with the real gate 81 of the gate structure 80 is distributed on a top surface (i.e., part of the top surface 621 of the doped sub-region 62) of one end of each doped sub-region 62 (wherein, the vertical projection of the inner side of the one end of each doped sub-region 62 is at one of two ends of the gate structure 80), the inversion channel region CA, and the junction area JA. In this way, the dielectric layer 90 isolates the real gate 81 from the doped sub-region 62, the well sub-region 51 and the drift layer 40.

Figure 4:
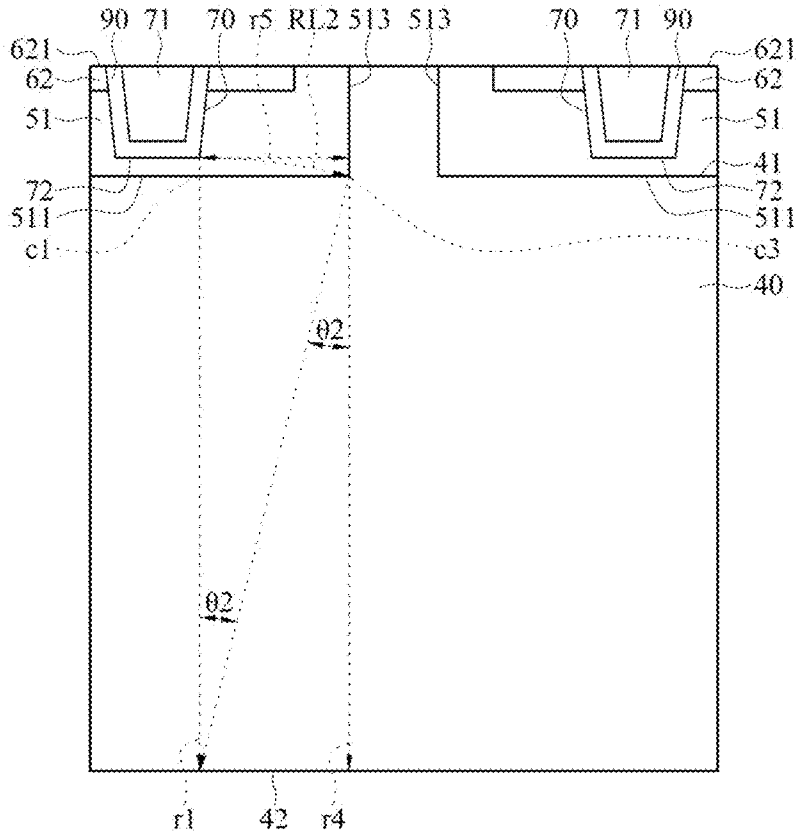
FIG. 4 is a partial schematic diagram of a component structure of a power semiconductor device according to a first embodiment.

FIG. 4 is a partial schematic diagram of a component structure of a power semiconductor device 10 according to a second embodiment. In some embodiments, the distance r1 between the bottom end 72 of each dummy trench 70 and the bottom 42 of the drift layer 40 is greater than or equal to a distance r4 between the bottom 511 of each well sub-region 51 and the bottom 42 of the drift layer 40. That is, the depth of each dummy trench 70 (herein, a distance that the bottom end 72 of the dummy trench 70 extends downward from the top surface 621 of the doped sub-region 62) is less than or equal to a distance between the top surface 621 of the doped sub-region 62 and the bottom 511 of the well sub-region 51. For clarity, FIG. 4 only illustrates that the distance r1 between the bottom end 72 of each dummy trench 70 and the bottom 42 of the drift layer 40 is greater than the distance r4 between the bottom 511 of each well sub-region 51 and the bottom 42 of the drift layer 40. In some embodiments, a difference between the distance r1 between the bottom end 72 of each dummy trench 70 and the bottom 42 of the drift layer 40 and the distance r4 between the bottom $11 of each well sub-region 51 and the bottom 42 of the drift layer 40 is less than 1 μm. In this way, the electric field can be uniformly dispersed effectively.

As shown in FIG. 4, in some embodiments, the distance r1 between the bottom end 72 of each dummy trench 70 and the bottom 42 of the drift layer 40 is the distance r4 between the bottom end 511 of each well sub-region 51 and the bottom 42 of the drift layer 40 divided by a cosine value of a second central angle $\theta_2$ (as shown in Equation 3). The second central angle $\theta_2$ corresponds to a second arc length RL2, two ends of the second arc length RL2 are a first corner c1 of the bottom end 72 of the dummy trench 70 and a third corner c3 of the bottom 511 of the corresponding passed well sub-region 51 on the same side as the first corner c1 respectively, the center of a circle where the second arc length RL2 is located is a point where the first corner c1 is vertically projected to the surface of the semiconductor substrate 30 (or the bottom 42 of the drift layer 40), and the radius is the distance r1.

$$r1 = \frac{r4}{\cos\theta_2} \quad \text{(Equation 3)}$$

As shown in FIG. 4, in some embodiments, a distance r5 between adjacent sides 513 of two well sub-regions 51 (i.e., the sides of the two well sub-regions 51 adjacent to each other) and two dummy trenches 70 (specifically, the distance r5 is a distance between adjacent sides 513 of a certain well sub-region 51 and the dummy trench 70 passing through the certain well sub-region 51) is substantially the distance r1 between the bottom end 72 of each dummy trench 70 and the bottom 42 of the drift layer 40 multiplied by a sine value of the second central angle $\theta_2$ (as shown in Equation 4).

$$r5 = r1 * \sin\theta_2 \quad \text{(Equation 4)}$$

In some embodiments, the distance r5 between adjacent sides 513 of two well sub-regions 51 and two dummy trenches 70 is less than 8 μm. In embodiments, the distance r5 between adjacent sides 513 of two well sub-regions 51 and two dummy trenches 70 is less than 2 μm. In this way, an effective charge balancing effect can be achieved.

As shown in FIG. 1 and FIG. 3, in some embodiments, a distance r6 between a top end 75 (i.e., the top end of the dummy gate 71 in the dummy trench 70) and a bottom end 72 of each dummy trench 70 is less than 4 μm. In embodiments, the distance r6 between the top end 75 and the bottom end 72 of each dummy trench 70 is 1.5 μm.

Figure 5:
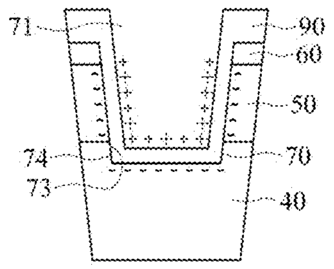
FIG. 5 is a schematic diagram of a dielectric layer according to some embodiments.

FIG. 5 is a schematic diagram of a dielectric layer 90 according to some embodiments. In some embodiments, the dielectric layer 90 is formed by a dielectric material with a high dielectric constant (e.g., a dielectric constant greater than 3.9). The dielectric material with a high dielectric constant is, for example, lanthanum aluminate ($LaAlO_3$), zirconium dioxide ($ZrO_2$), hafnium dioxide ($HfO_2$), gallium oxide ($Ga_2O_3$), aluminum oxide ($Al_2O_3$), titanium dioxide ($TiO_2$) or tantalum pentoxide ($Ta_2O_5$). However, the present disclosure is not limited thereto. The dielectric layer 90 may also be formed by a dielectric material with a low dielectric constant (e.g., a dielectric constant less than or equal to 3.9). The dielectric material with a low dielectric constant is, for example, silicon dioxide ($SiO_2$), silicon nitride (SiON) or silicon nitride (SiN). In the case where the dielectric layer 90 is formed by a dielectric material with a high dielectric constant, since the dielectric material with a high dielectric constant is a polar material, a negative charge (as shown by "–" in FIG. 5) may be formed on a position (i.e., the outer wall 74 of the dummy trench 70) where the dielectric layer 90 on the inner wall 73 of the dummy trench 70 is in contact with the well region 50 and a position (i.e., the outer wall 74 of the dummy trench 70) where the dielectric layer 90 on the inner wall 73 of the dummy trench 70 is in contact with the drift layer 40, and a positive charge (as shown by "+" in FIG. 5) is formed in the dummy trench 70 through the dipole effect. In this way, the charge quantity, charge distribution and electric field distribution of the outer wall 74 of the dummy trench 70 are adjusted by the dielectric layer 90 formed by the dielectric material with a high dielectric constant, so that the electric field is dispersed rather than concentrated.

As shown in FIG. 1 and FIG. 3, in the first embodiment and the second embodiment, the power semiconductor device 10 includes two contact pads (hereinafter referred to as a first contact pad CT1) that pass through the dielectric layer 90 to be in contact with the doped region 60 (or in contact with two doped sub-regions 62 of the doped region 60, respectively) without contacting each dummy gate 71. The first contact pad CT1 serves as an external source terminal (hereinafter referred to as a source terminal) of the power semiconductor device 10 to receive a voltage from the outside and transmit the voltage to the doped region 60 (or two doped sub-regions 62 of the doped region 60). In the first embodiment and the second embodiment, since the dummy gate 71 of the dummy trench 70 is not connected to any contact pad (e.g., two first contact pads CT1), the dummy gate 71 of the dummy trench 70 is floating. Specifically, the potential of the dummy gate 71 of the dummy trench 70 is floating, rather than fixed. Therefore, the dummy gate 71 of the dummy trench 70 can optimally generate the capacitive effect to disperse the electric field distribution. In some embodiments, the first contact pad CT1 is a conductor made of a metal material having a higher electrical conductivity than the semiconductor, and the semiconductor has a higher electrical conductivity than an insulator. The metal material is, for example, gold, silver, aluminum or copper, etc.

Figure 6:
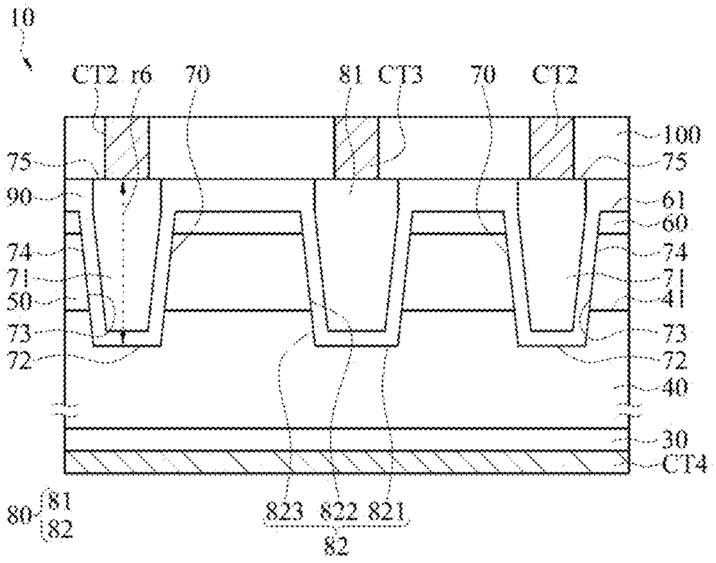
FIG. 6 is a schematic diagram of a component structure of a power semiconductor device according to a third embodiment.

FIG. 6 is a schematic diagram of a component structure of a power semiconductor device 10 according to a third embodiment. Like the first embodiment and the second embodiment, the power semiconductor device 10 of the third embodiment also includes a semiconductor substrate 30, a drift layer 40, a well region 50, a doped region 60, two dummy trenches 70, a gate structure 80, and a dielectric layer 90, and the main difference is that the power semiconductor device 10 of the third embodiment has two contact pads (hereinafter referred to as a second contact pad CT2) respectively in contact with dummy gates 71 of two dummy trenches 70 without contacting the doped region 60. The second contact pad CT2 serves as a source terminal of the power semiconductor device 10, and the composition is the same or similar to the first contact pad CT1, and thus it is not repeated. The second contact pad CT2 receives a voltage from the outside and transmits the voltage to the dummy gate 71 of the dummy trench 70. That is, in the third embodiment, the dummy gate 71 of the dummy trench 70 is non-floating, namely, the potential of the dummy gate 71 of the dummy trench 70 is controlled by the external voltage received by the second contact pad CT2.

As shown in FIG. 1, FIG. 3, and FIG. 6, in some embodiments, the power semiconductor device 10 further includes a metal interlayer dielectric layer 100. The metal interlayer dielectric layer 100 is on the dielectric layer 90, each dummy gate 71 and the real gate 81. In some embodiments, the metal interlayer dielectric layer 100 can be formed by silicon glass (PSG) or borophosphosilicate glass (BPSG). As shown in FIG. 1 and FIG. 3, in the first embodiment and the second embodiment, two first contact pads CT1 pass through the metal interlayer dielectric layer 100 and the dielectric layer 90 to be in contact with the doped region 60 (or in contact with two doped sub-regions 62 of the doped region 60, respectively) without contacting each dummy gate 71. As shown in FIG. 6, in the third embodiment, two second contact pads CT2 pass through the metal interlayer dielectric layer 100 to be in contact with dummy gates 71 of two dummy trenches 70 respectively without contacting the doped region 60.

As shown in FIG. 1, FIG. 3, and FIG. 6, in some embodiments, the power semiconductor device 10 further includes another contact pad (hereinafter referred to as a third contact pad CT3) that passes through the metal interlayer dielectric layer 100 to be in contact with the real gate 81. The third contact pad CT3 serves as an external gate terminal of the power semiconductor device 10 (hereinafter referred to as a gate terminal), and the composition is the same or similar to the first contact pad CT1, and thus it is not repeated. The third contact pad CT3 receives a voltage from the outside and transmits the voltage to the real gate 81.

As shown in FIG. 1, FIG. 3, and FIG. 6, in some embodiments, the power semiconductor device 10 further includes yet another contact pad (hereinafter referred to as a fourth contact pad CT4) below the semiconductor substrate 30. The fourth contact pad CT4 serves as an external drain terminal of the power semiconductor device 10 (hereinafter referred to as a drain terminal), and the composition is the same or similar to the first contact pad CT1, and thus it is not repeated. The fourth contact pad CT4 receives a voltage from the outside and transmits the voltage to the semiconductor substrate 30.

In the first embodiment and the third embodiment, the power semiconductor device 10 may be a Trench MOSFET. In the second embodiment, the power semiconductor device 10 may be a VD-MOSFET.

Figure 7:
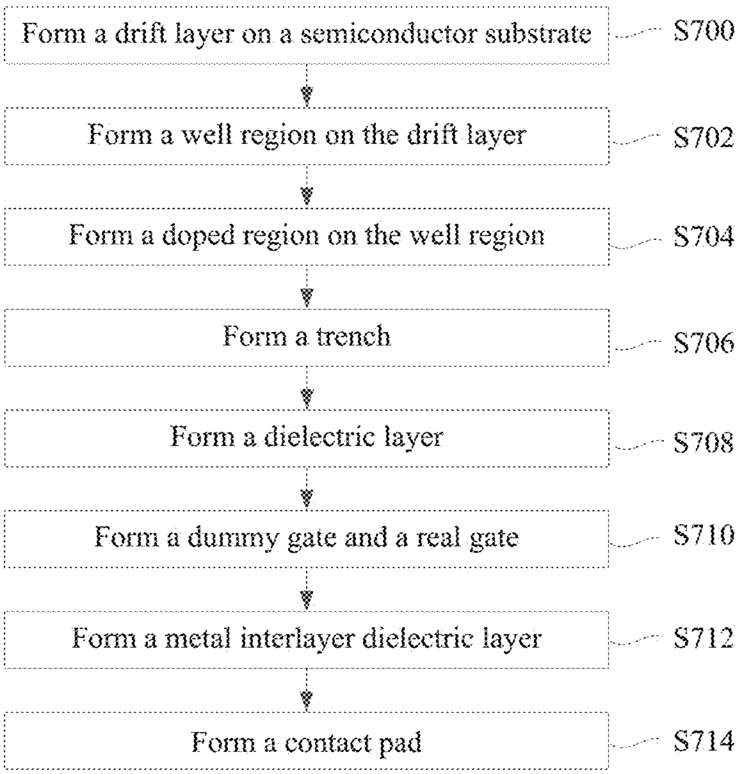
FIG. 7 is a process flow chart of a power semiconductor device according to some embodiments.

Next, the manufacturing process of the foregoing embodiments is described. FIG. 7 is a process flow chart of a power semiconductor device 10 according to some embodiments. FIG. 8 to FIG. 12 are schematic structural diagrams of a power semiconductor device 10 to be manufactured at different stages of a process method according to a first embodiment. FIG. 13 to FIG. 17 are schematic structural diagrams of a power semiconductor device 10 to be manufactured at different stages of a process method according to a second embodiment. FIG. 18 to FIG. 22 are schematic structural diagrams of a power semiconductor device 10 to be manufactured at different stages of a process method according to a third embodiment.

Figure 8:
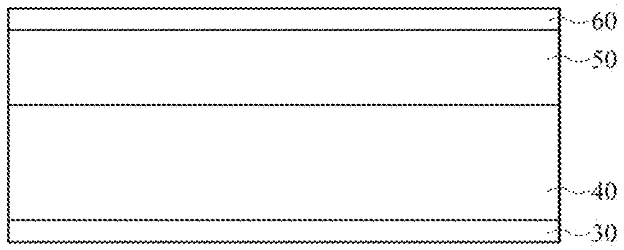
FIG. 8 to FIG. 12 are schematic structural diagrams of a power semiconductor device to be manufactured at different stages of a process method according to a first embodiment.
Figure 13:
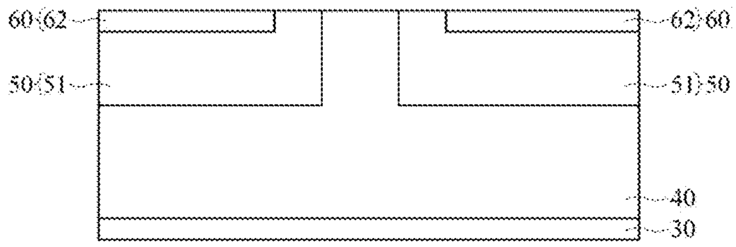
FIG. 13 to FIG. 17 are schematic structural diagrams of a power semiconductor device to be manufactured at different stages of a process method according to a second embodiment.
Figure 18:
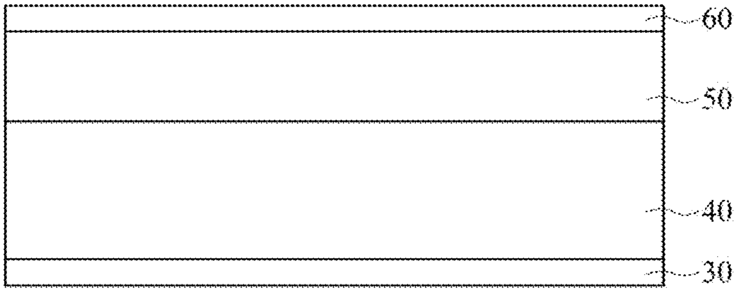
FIG. 18 to FIG. 22 are schematic structural diagrams of a power semiconductor device to be manufactured at different stages of a process method according to a third embodiment.

First, as shown in FIG. 8, FIG. 13, and FIG. 18, a drift layer 40 is formed on a semiconductor substrate 30 (step S700 in FIG. 7). For example, the drift layer 40 is formed on the semiconductor substrate 30 through a gas phase epitaxy process. Next, a well region 50 is formed on the drift 40 (step S702 in FIG. 7), and a doped region 60 is formed on the well region 50 (step S704 in FIG. 7). For example, as shown in FIG. 8 and FIG. 18, in the first embodiment and the third embodiment, the well region 50 is formed on the drift layer 40, and the doped region 60 is formed on the well region 50 through an ion implantation process. As shown in FIG. 13, in the second embodiment, two well sub-regions 51 of the well region 50 are formed on the drift layer 40, and two doped sub-regions 62 of the doped region 60 are formed on the two well sub-regions 51 through an etching process and the ion implantation process.

Figure 9:
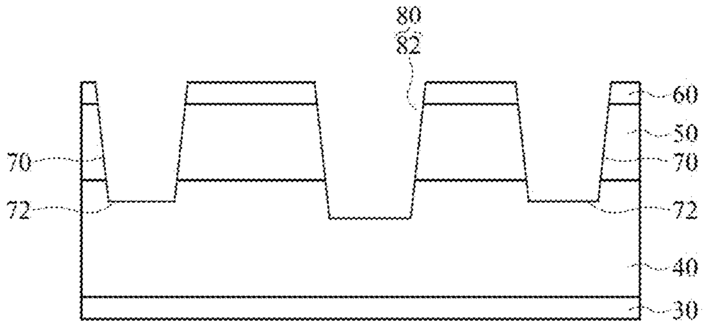
Figure 14:
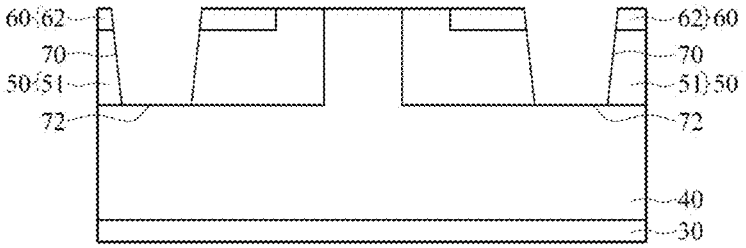
Figure 19:
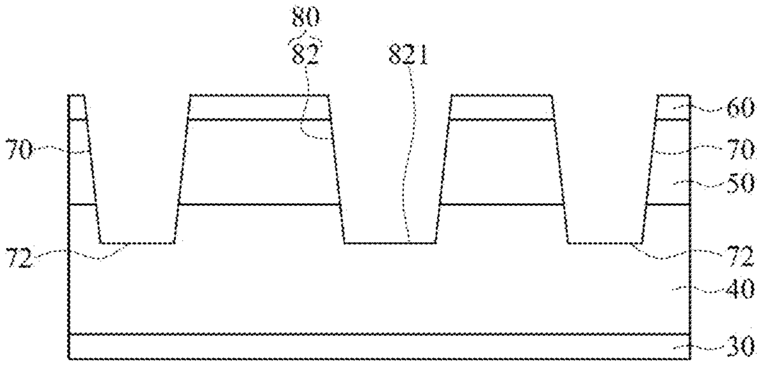

Next, as shown in FIG. 9, FIG. 14, and FIG. 19, a trench is formed (step S706 in FIG. 7). For example, as shown in FIG. 9 and FIG. 19, in the first embodiment and the third embodiment, a dummy trench 70 and a gate trench 82 of a gate structure 80 are formed through the etching process, and pass through the doped region 60 and the well region 50, and a bottom end 72 of the dummy trench 70 and a bottom end 821 of the gate trench 82 can extend into the drift layer 40. As shown in FIG. 14, in the second embodiment, the dummy trench 70 is formed through the etching process, and passes through the doped sub-regions 62 of the doped region 60 and the well sub-regions 51 of the well region 50.

Figure 10:
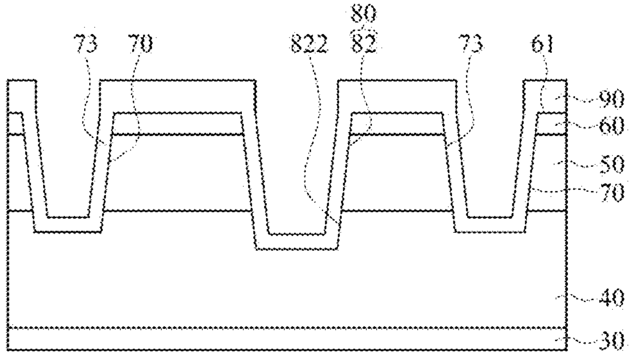
Figure 15:
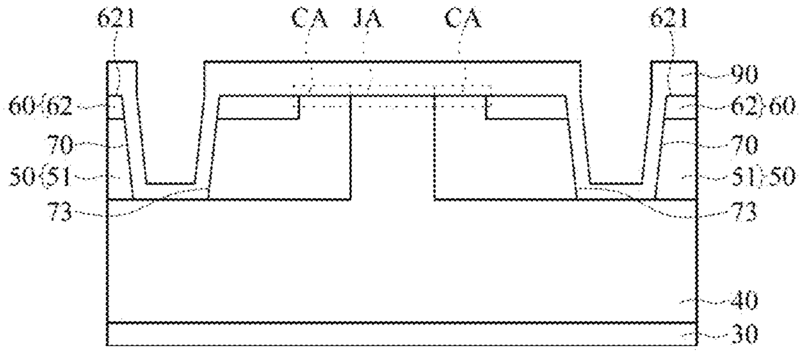
Figure 20:
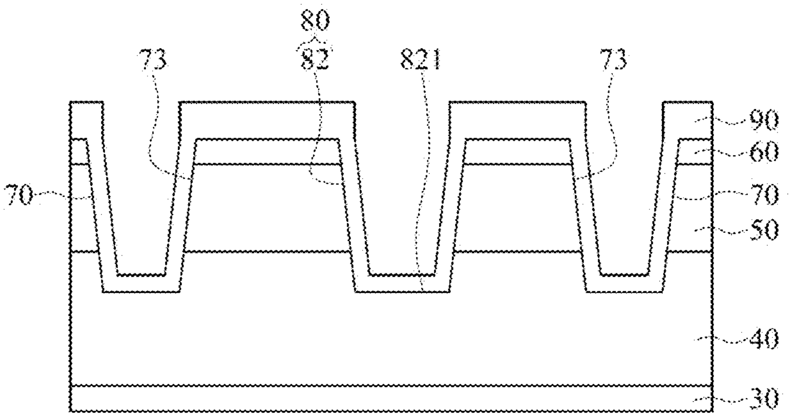

Next, as shown in FIG. 10, FIG. 15, and FIG. 20, a dielectric layer 90 is formed (step S708 in FIG. 7). For example, as shown in FIG. 10 and FIG. 20, in the first embodiment and the third embodiment, a dielectric layer 90 is formed on an inner wall 73 of the dummy trench 70, an inner wall 822 of the gate trench 82, and a top surface 61 of the doped region 60 through a deposition process. As shown in FIG. 15, in the second embodiment, a dielectric layer 90 is formed on the inner wall 73 of the dummy trench 70, a top surface 621 of the doped sub-region 62 of the doped region 60, a channel area CA, and a junction area JA through the deposition process.

Figure 11:
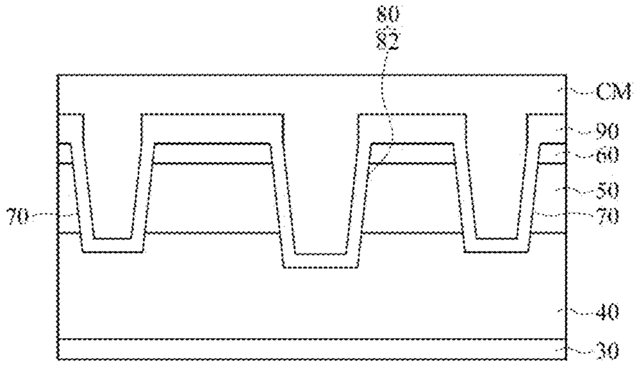
Figure 12:
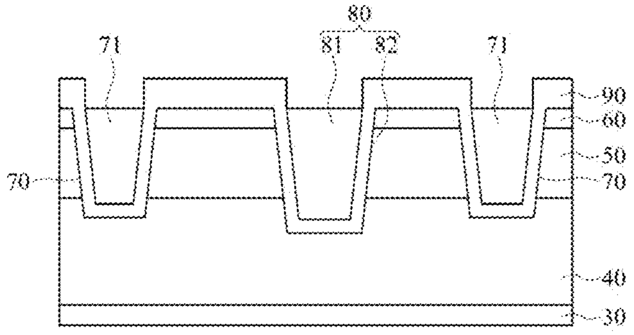
Figure 16:
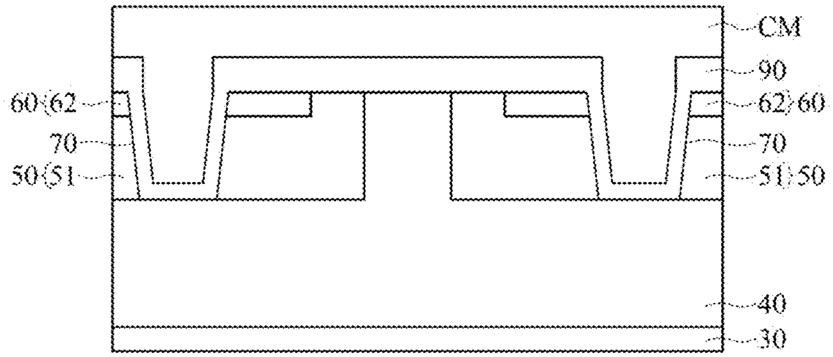
Figure 17:
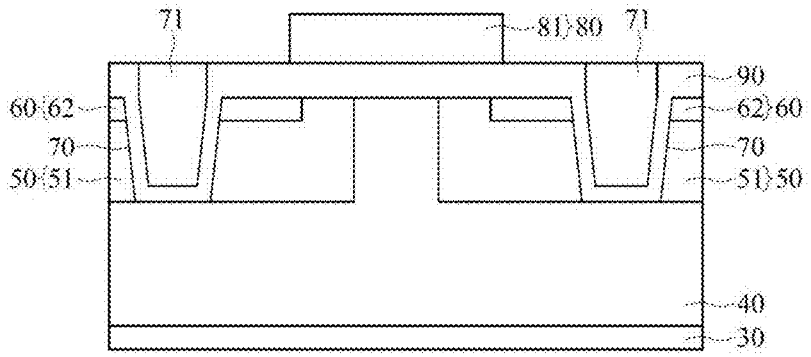
Figure 21:
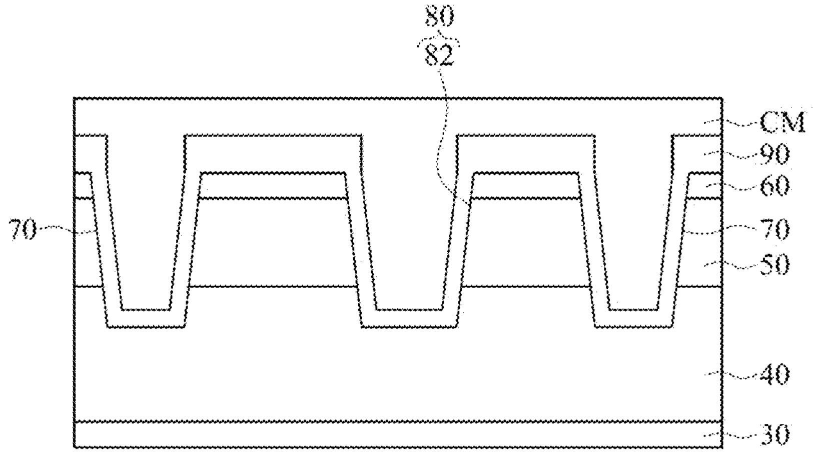
Figure 22:
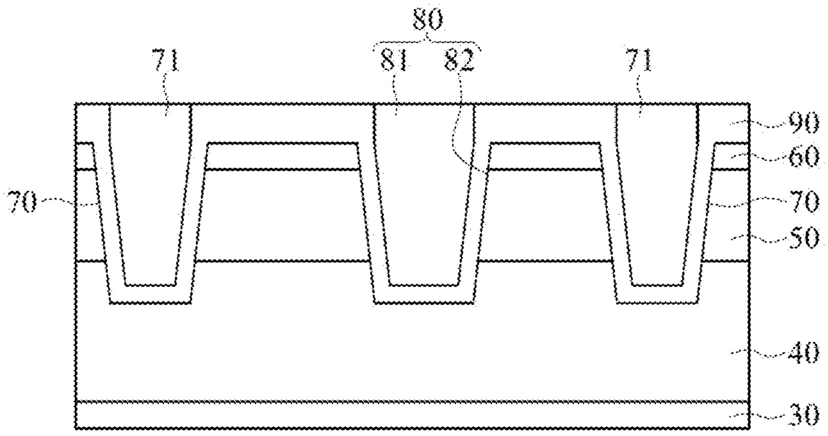

Next, as shown in FIG. 11, FIG. 12, FIG. 16, FIG. 17, FIG. 21, and FIG. 22, a dummy gate 71 and a real gate 81 are formed (step S710 in FIG. 7). For example, as shown in FIG. 11, FIG. 16, and FIG. 21, a conductive material CM is deposited on the dielectric layer 90 through the deposition process. The conductive material CM is, for example, polysilicon, titanium, aluminum, tungsten or gold. Then, as shown in FIG. 12, FIG. 17, and FIG. 22, the etching process is performed on the conductive material CM, to form the dummy gate 71 and the real gate 81 realized by the conductive material CM. As shown in FIG. 12 and FIG. 22, in the first embodiment and the third embodiment, the dummy gate 71 is formed in the dummy trench 70, and the real gate 81 is formed in the gate trench 82. As shown in FIG. 17, in the second embodiment, the dummy gate 71 is formed in the dummy trench 70, and the real gate 81 is formed on the dielectric layer 90.

Next, as shown in FIG. 1, FIG. 3, and FIG. 6, a metal interlayer dielectric layer 100 is formed (step S712 in FIG. 7), and a contact pad is formed (step S714 in FIG. 7). For example, the metal interlayer dielectric layer 100 is formed on the dielectric layer 90, each dummy gate 71, and the real gate 81 through the deposition process. Then, the etching process is performed on the metal interlayer dielectric layer 100 and the dielectric layer 90, and a metal sputtering process is performed with the metal material, to form contact pads (e.g., the first contact pad CT1, the second contact pad CT2, and the third contact pad CT3 as shown in FIG. 1, FIG. 3, and FIG. 6). Next, a back metal coating process is performed with the metal material on the bottom of the semiconductor substrate 30, to form a fourth contact pad CT4. Then, the power semiconductor device 10 can be manufactured after other processes (e.g., an encapsulation process).

Figure 24:
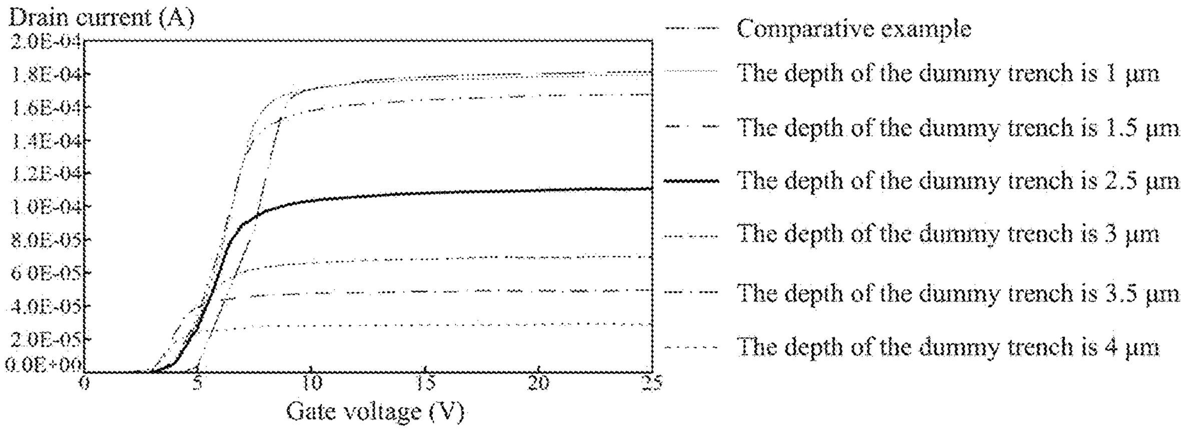
FIG. 24 is a schematic diagram of a characteristic curve between a gate voltage (Vg) and a drain current (Id) of a power semiconductor device without a dummy trench according to a comparative example and a characteristic curve between a gate voltage and a drain current of a power semiconductor device at different distances between a top end and a bottom end of a dummy trench according to some embodiments.
Figure 25:
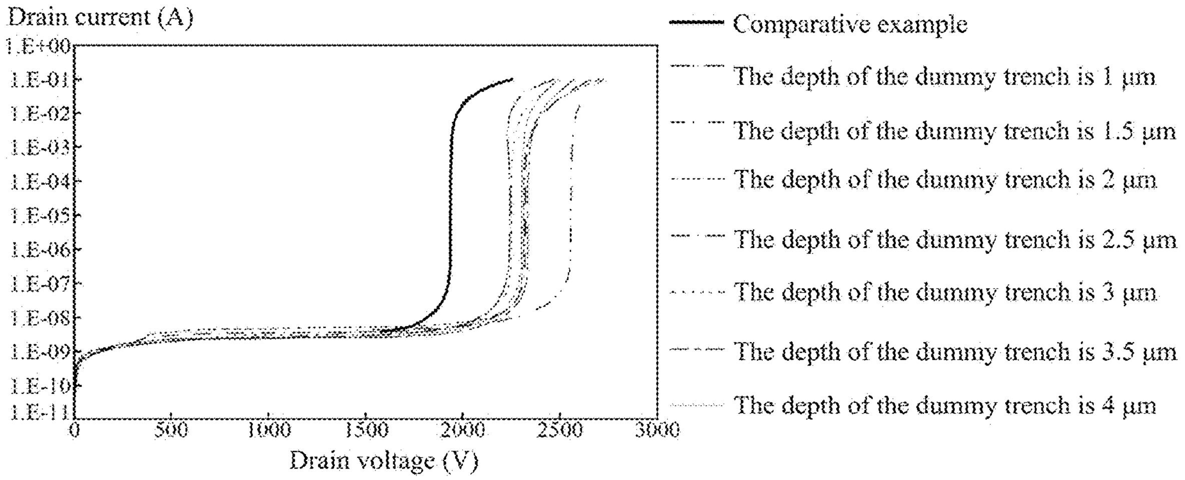
FIG. 25 is a schematic diagram of a characteristic curve between a drain voltage (Va) and a drain current of a power semiconductor device without a dummy trench according to a comparative example and a characteristic curve between a drain voltage and a drain current of a power semiconductor device at different distances between a top end and a bottom end of a dummy trench according to some embodiments.
Figure 26:
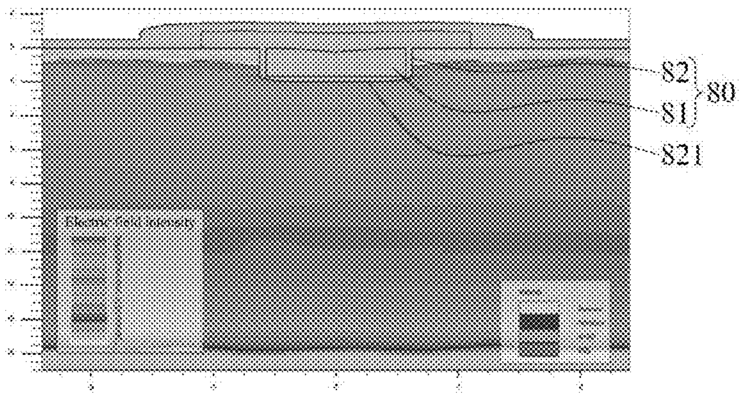
FIG. 26 is a schematic diagram of electric field distribution of a power semiconductor device without a dummy trench according to a comparative example.
Figure 27:
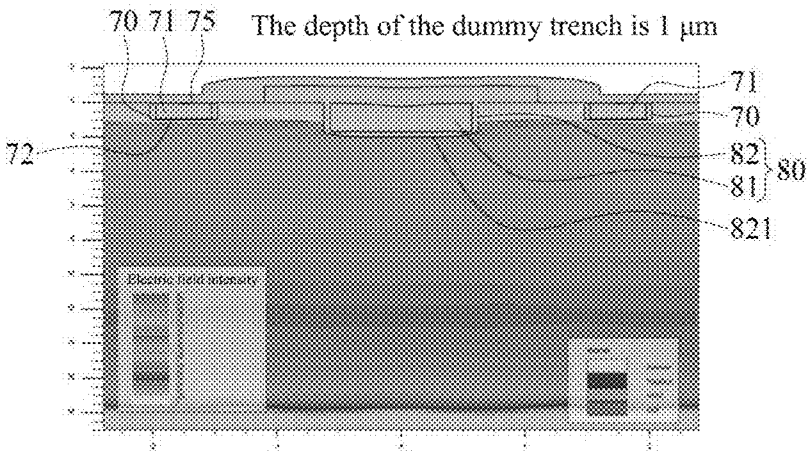
FIG. 27 is a schematic diagram of electric field distribution of a power semiconductor device at a distance of 1 μm between a top end and a bottom end of a dummy trench according to some embodiments.
Figure 28:
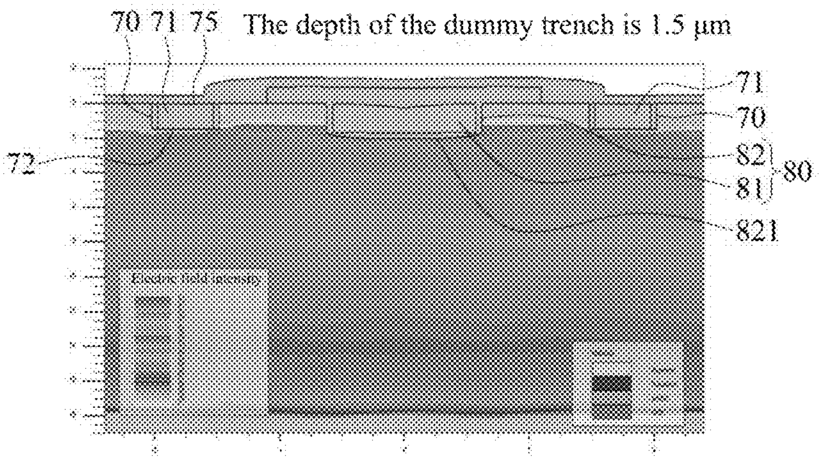
FIG. 28 is a schematic diagram of electric field distribution of a power semiconductor device at a distance of 1.5 μm between a top end and a bottom end of a dummy trench according to some embodiments.
Figure 29:
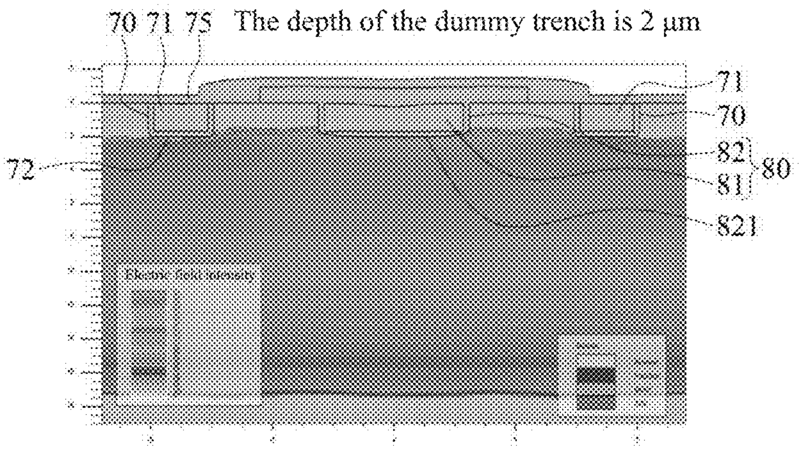
FIG. 29 is a schematic diagram of electric field distribution of a power semiconductor device at a distance of 2 μm between a top end and a bottom end of a dummy trench according to some embodiments.
Figure 30:
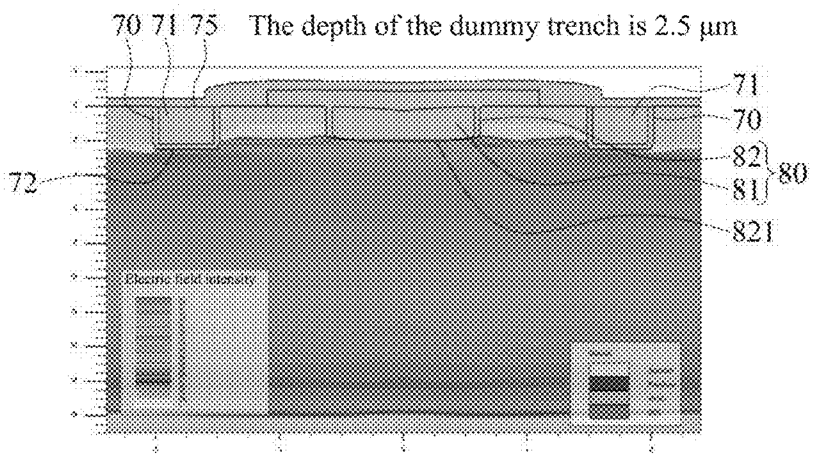
FIG. 30 is a schematic diagram of electric field distribution of a power semiconductor device at a distance of 2.5 μm between a top end and a bottom end of a dummy trench according to some embodiments.
Figure 31:
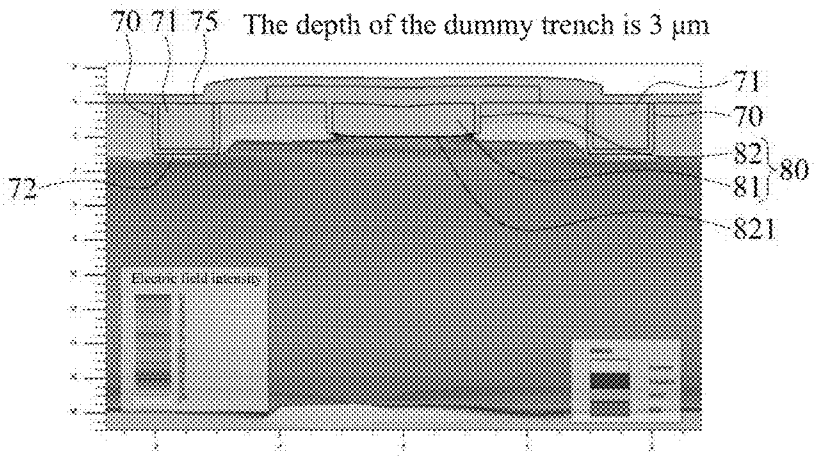
FIG. 31 is a schematic diagram of electric field distribution of a power semiconductor device at a distance of 3 μm between a top end and a bottom end of a dummy trench according to some embodiments.
Figure 32:
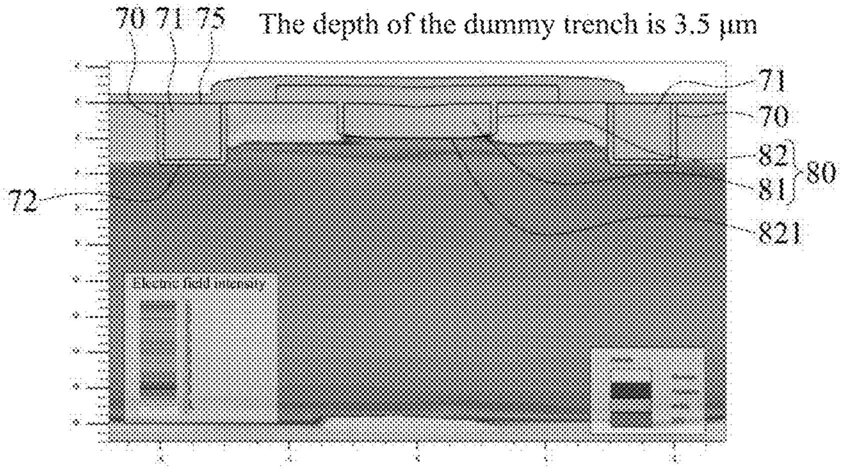
FIG. 32 is a schematic diagram of electric field distribution of a power semiconductor device at a distance of 3.5 μm between a top end and a bottom end of a dummy trench according to some embodiments.
Figure 33:
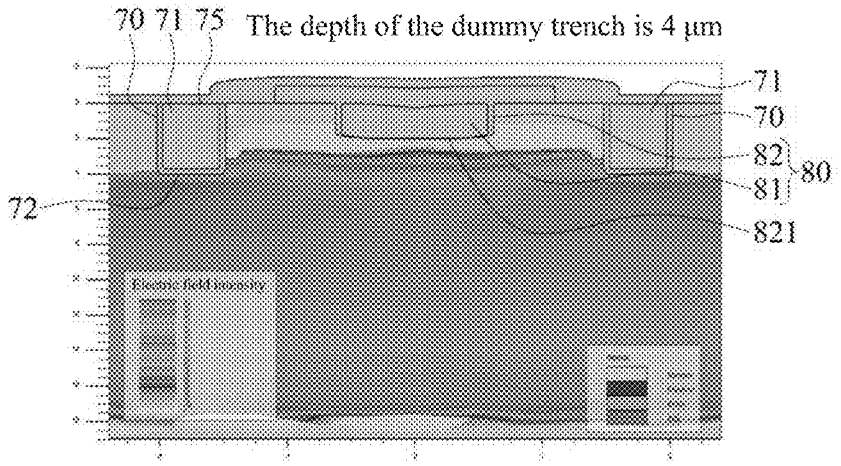
FIG. 33 is a schematic diagram of electric field distribution of a power semiconductor device at a distance of 4 μm between a top end and a bottom end of a dummy trench according to some embodiments.

Refer to FIG. 23 to FIG. 33. FIG. 23 is a schematic diagram of characteristic parameters of a power semiconductor device without a dummy trench 70 according to a comparative example and characteristic parameters of a power semiconductor device 10 at a distance r6 between a top end 75 and a bottom end 72 of a dummy trench 70 according to some embodiments. FIG. 24 is a schematic diagram of a characteristic curve between a gate voltage (Vg) and a drain current (Id) of a power semiconductor device without a dummy trench 70 according to a comparative example and a characteristic curve between a gate voltage and a drain current of a power semiconductor device 10 at a different distance r6 between a top end 75 and a bottom end 72 of a dummy trench 70 according to some embodiments. FIG. 25 is a schematic diagram of a characteristic curve between a drain voltage (Va) and a drain current of a power semiconductor device without a dummy trench 70 according to a comparative example and a characteristic curve between a drain voltage and a drain current of a power semiconductor device 10 at a different distance r6 between a top end 75 and a bottom end 72 of a dummy trench 70 according to some embodiments. FIG. 26 is a schematic diagram of electric field distribution of a power semiconductor device without a dummy trench 70 according to a comparative example. FIG. 27 is a schematic diagram of electric field distribution of a power semiconductor device 10 at a distance r6 of 1 μm between a top end 75 and a bottom end 72 of a dummy trench 70 according to some embodiments. FIG. 28 is a schematic diagram of electric field distribution of a power semiconductor device 10 at a distance r6 of 1.5 μm between a top end 75 and a bottom end 72 of a dummy trench 70 according to some embodiments. FIG. 29 is a schematic diagram of electric field distribution of a power semiconductor device 10 at a distance r6 of 2 μm between a top end 75 and a bottom end 72 of a dummy trench 70 according to some embodiments. FIG. 30 is a schematic diagram of electric field distribution of a power semiconductor device 10 at a distance r6 of 2.5 μm between a top end 75 and a bottom end 72 of a dummy trench 70 according to some embodiments. FIG. 31 is a schematic diagram of electric field distribution of a power semiconductor device 10 at a distance r6 of 3 μm between a top end 75 and a bottom end 72 of a dummy trench 70 according to some embodiments. FIG. 32 is a schematic diagram of electric field distribution of a power semiconductor device 10 at a distance r6 of 3.5 μm between a top end 75 and a bottom end 72 of a dummy trench 70 according to some embodiments. FIG. 33 is a schematic diagram of electric field distribution of a power semiconductor device 10 at a distance r6 of 4 μm between a top end 75 and a bottom end 72 of a dummy trench 70 according to some embodiments. The comparative example relates to a power semiconductor device without a dummy trench 70, and therefore do not have the distance r6 between the top end 75 and the bottom end 72 of the dummy trench 70, that is, the distance r6 is 0. For ease of illustration, the distance r6 between the top end 75 and the bottom end 72 of the dummy trench 70 is hereinafter referred to as a depth of the dummy trench 70.

As can be seen from FIG. 23 to FIG. 33, as the depth of the dummy trench 70 gradually increases from 0, the dummy trench 70 and the dummy gate 71 thereof form the capacitive effect to gradually attract an electric field concentrated at the bottom of the gate structure 80 (e.g., the bottom end 821 of the gate trench 82) or the bottom of the well region 50 to the bottom end 72 of the dummy trench 70, thereby gradually increasing the breakdown voltage at a slight sacrifice of the current density of the power semiconductor device 10. After the depth of the dummy trench 70 exceeds 1.5 μm, as the depth of the dummy trench 70 increases, the attraction of the dummy trench 70 and the dummy gate 71 thereof to the electric field is stronger than the attraction of the gate structure 80 and the real gate 81 thereof to the electric field, causing the electric field to be concentrated at the bottom end 72 of the dummy trench 70, and the increase in the breakdown voltage gradually decreases. Therefore, when the depth of the dummy trench 70 is 1.5 μm, the dummy trench 70 and the dummy gate 71 thereof have the greatest increase in the breakdown voltage of the power semiconductor device 10. Specifically, compared with the comparative example, when the depth of the dummy trench 70 is 1.5 μm, the breakdown voltage of the power semiconductor device 10 according to some embodiments is increased by at least 600 volts (V) (e.g., 622 V). Compared with the comparative example, when the depth of the dummy trench 70 is another value (e.g., 1 μm, 2 μm, 2.5 μm, 3 μm, 3.5 μm, or 4 μm) rather than 1.5 μm, the breakdown voltage of the power semiconductor device 10 according to some embodiments still increases a certain extent.

Refer to FIG. 34 to FIG. 38. FIG. 34 is a schematic diagram of a parasitic capacitance of a power semiconductor device without a dummy trench 70 according to a comparative example and a parasitic capacitance of a power semiconductor device 10 at a different distance r6 between a top end 75 and a bottom end 72 of a dummy trench 70 according to some embodiments. FIG. 35 is a schematic diagram of a characteristic curve between a gate-drain parasitic capacitance ($C_{gd}$) and a drain voltage of a power semiconductor device without a dummy trench 70 according to a comparative example and a characteristic curve between a gate-drain parasitic capacitance and a drain voltage of a power semiconductor device 10 at a different distance r6 between a top end 75 and a bottom end 72 of a dummy trench 70 according to some embodiments. FIG. 36 is a schematic diagram of rise time and fall time of a power semiconductor device without a dummy trench 70 according to a comparative example and rise time and fall time of a power semiconductor device 10 at a different distance r6 between a top end 75 and a bottom end 72 of a dummy trench 70 according to some embodiments. FIG. 37 is a schematic diagram of a characteristic curve between a drain voltage and transition time of a power semiconductor device without a dummy trench 70 when being turned on (i.e., conductively) according to a comparative example and a characteristic curve between a drain voltage and transition time of a power semiconductor device 10 when being turned on at a different distance r6 between a top end 75 and a bottom end 72 of a dummy trench 70 according to some embodiments. FIG. 38 is a schematic diagram of a characteristic curve between a drain voltage and transition time of a power semiconductor device without a dummy trench 70 when being turned off (i.e., non-conductively) according to a comparative example and a characteristic curve between a drain voltage and transition time of a power semiconductor device 10 when being turned off at a different distance r6 between a top end 75 and a bottom end 72 of a dummy trench 70 according to some embodiments. The comparative example relates to a power semiconductor device without a dummy trench 70, and therefore do not have the distance r6 between the top end 75 and the bottom end 72 of the dummy trench 70, that is, the distance r6 is 0. For ease of illustration, the distance r6 between the top end 75 and the bottom end 72 of the dummy trench 70 is hereinafter referred to as a depth of the dummy trench 70.

In FIG. 34, a gate-source parasitic capacitance ($C_{gs}$) represents a parasitic capacitance between a gate and a source of a power semiconductor device without a dummy trench 70 according to a comparative example and a parasitic capacitance between a gate and a source of a power semiconductor device 10 according to some embodiments. A drain-source parasitic capacitance ($C_{ds}$) represents a parasitic capacitance between a drain and a source of a power semiconductor device without a dummy trench 70 according to a comparative example and a parasitic capacitance between a drain and a source of a power semiconductor device 10 according to some embodiments. A gate-drain parasitic capacitance ($C_{gd}$) represents a parasitic capacitance between a gate and a drain of a power semiconductor device without a dummy trench 70 according to a comparative example and a parasitic capacitance between a gate and a drain of a power semiconductor device 10 according to some embodiments. An input power capacitance ($C_{iss}$) is the sum of the gate-source parasitic capacitance and the gate-drain parasitic capacitance. An output power capacitance ($C_{oss}$) is the sum of the drain-source parasitic capacitance and the gate-drain parasitic capacitance. A feedback capacitance (or called reverse transfer capacitance) ($C_{iss}$) is the gate-drain parasitic capacitance. The rise time is the time when a voltage between the drain and the source (i.e., a source-drain voltage ($V_{ds}$)) (or a drain voltage) falls from 90% to 10%. The fall time is the time when the voltage between the drain and the source (i.e., the drain voltage) rises from 10% to 90%.

As can be seen from FIG. 34 to FIG. 38, compared with the comparative example, the power semiconductor device 10 according to some embodiments has better dynamic characteristics through the dummy trench 70 and the dummy gate 71 thereof. For example, the rise time and the fall time of the power semiconductor device 10 have better time values, and the parasitic capacitance has a better capacitance value to reduce conduction loss and turn-off loss. As can be seen from FIG. 34 to FIG. 38, when the depth of the dummy trench 70 is 1.5 μm, the power semiconductor device 10 according to some embodiments has optimal dynamic characteristics.

In conclusion, according to some embodiments, the present disclosure can balance the charge and uniformly disperse the electric field through dummy trenches and dummy gates thereof, so that the electric field is not concentrated at the bottom of the well region or the bottom of the gate structure (e.g., the bottom end of the gate trench). In this way, the voltage resistance capability of the power semiconductor device can be increased (i.e., the breakdown voltage can be increased), so that avalanche breakdown occurs in the power semiconductor device later.

What is claimed is:

1. A power semiconductor device, comprising:

a semiconductor substrate doped with a first element in a first element family to have a first conductive channel;

a drift layer on the semiconductor substrate and doped with a second element in the first element family to have the first conductive channel;

a well region on the drift layer and doped with a third element in a second element family to have a second conductive channel having a polarity opposite to that of the first conductive channel;

a doped region on the well region and doped with a fourth element in the first element family to have the first conductive channel;

two dummy trenches passing through the doped region and the well region, each of the dummy trenches having a dummy gate;

a gate structure between the two dummy trenches and having a real gate; and a dielectric layer configured to isolate each dummy gate and the real gate from the doped region, the well region and the drift layer;

wherein, the gate structure comprises a gate trench passing through the doped region and the well region, and the real gate is in the gate trench;

wherein, a distance between the bottom end of each dummy trench and the bottom of the drift layer is greater than a distance between a bottom end of the gate trench and the bottom of the drift layer.

2. The power semiconductor device according to claim 1, wherein the bottom of the gate structure is lower than or equal to a bottom end of each dummy trench.

3. The power semiconductor device according to claim 1, wherein the distance between the bottom end of each dummy trench and the bottom of the drift layer is the distance between the bottom end of the gate trench and the bottom of the drift layer divided by a cosine value of a first central angle, the first central angle corresponds to a first arc length between a first corner of the bottom end of each dummy trench and a second corner of the bottom end of the gate trench, and the second corner is adjacent to the first corner.

4. The power semiconductor device according to claim 1, wherein a distance between two sides of the gate trench and the two dummy trenches is the distance between the bottom end of each dummy trench and the bottom of the drift layer multiplied by a sine value of a first central angle, the first central angle corresponds to a first arc length between a first corner of the bottom end of each dummy trench and a second corner of the bottom end of the gate trench, and the second corner is adjacent to the first corner.

5. The power semiconductor device according to claim 1, further comprising two contact pads that pass through the dielectric layer to be in contact with the doped region without contacting each dummy gate.

6. The power semiconductor device according to claim 5, further comprising a metal interlayer dielectric layer on the dielectric layer, each dummy gate and the real gate, wherein the two contact pads pass through the metal interlayer dielectric layer and the dielectric layer to be in contact with the doped region without contacting the dummy gate.

7. The power semiconductor device according to claim 6, further comprising another contact pad that passes through the metal interlayer dielectric layer to be in contact with the real gate.

8. The power semiconductor device according to claim 1, further comprising two contact pads that are respectively in contact with each dummy gate without contacting the doped region.

9. The power semiconductor device according to claim 8, further comprising a metal interlayer dielectric layer on the dielectric layer, each dummy gate and the real gate, wherein the two contact pads pass through the metal interlayer dielectric layer to be respectively in contact with each dummy gate without contacting the doped region.

10. The power semiconductor device according to claim 9, further comprising another contact pad that passes through the metal interlayer dielectric layer to be in contact with the real gate.

11. The power semiconductor device according to claim 1, wherein the dielectric layer is formed by a dielectric material having a dielectric constant greater than 3.9.

12. The power semiconductor device according to claim 1, wherein the dielectric layer is formed by a dielectric material having a dielectric constant less than or equal to 3.9.

* * * * *